United States Patent [19]
Nagatomo

[11] Patent Number: 6,031,772
[45] Date of Patent: Feb. 29, 2000

[54] SEMICONDUCTOR MEMORY DEVICE HAVING FLOATING GATE TRANSISTORS

[75] Inventor: Masahiko Nagatomo, Miyazaki, Japan

[73] Assignee: Oki Electric Industry Co., Ltd., Tokyo, Japan

[21] Appl. No.: 09/099,434

[22] Filed: Jun. 18, 1998

[30] Foreign Application Priority Data

Jun. 20, 1997 [JP] Japan .................................... 9-164440

[51] Int. Cl.[7] .................................................. G11C 7/00
[52] U.S. Cl. .......................................... 365/201; 371/21.1
[58] Field of Search .............................. 365/201, 185.05, 365/185.11, 185.18, 185.22, 200; 371/21.1

[56] References Cited

U.S. PATENT DOCUMENTS

| | | | |
|---|---|---|---|
| 5,590,075 | 12/1996 | Mazzali | 365/201 |
| 5,606,527 | 2/1997 | Kwack et al. | 365/201 |
| 5,646,891 | 7/1997 | Okamoto | 365/201 |
| 5,742,615 | 4/1998 | Kondo et al. | 365/201 |
| 5,867,436 | 2/1999 | Furutani et al. | 365/201 |
| 5,870,333 | 2/1999 | Matsumoto | 365/201 |

*Primary Examiner*—Son T. Dinh
*Attorney, Agent, or Firm*—Jones Volentine, LLP

[57] ABSTRACT

A semiconductor memory device of the present invention comprises a memory cell array including row lines, column lines and memory cells arranged in rows and columns is disclosed. Each memory cell is connected to one of the row lines and one of the column lines. The semiconductor memory device further comprises a row select circuit connected to the row lines for selecting one of the row lines in response to a row select signal, a column select circuit connected to the column lines for selecting one of the column lines in response to a column select signal, a potential detector connected to the memory cell array for detecting a potential level of the lines of the memory cell array, and a test memory cell array connected to said potential detector through a test line. The test memory cell array tests a structural default of the row lines. The test memory cell array has a row of transistors each of which has a source connected to a potential source. The drains of the transistors are connected to the test line and to nothing in turn.

25 Claims, 3 Drawing Sheets

SEMICONDUCTOR MEMORY DEVICE HAVING FLOATING GATE TRANSISTORS

BACKGROUND OF THE INVENTION

The present invention relates to a semiconductor device including memory cells having floating gates and more particularly relates to a semiconductor device such as "One Time Programmable read only memory." (hereinafter abbreviated to "OTP")

An OTP has memory cells of the same configuration as memory cells for Erasable Programmable Read Only Memory (hereinafter abbreviated to "EPROM"), i.e. Programmable Read Only Memory (P-ROM) equipped with memory cells constructed using Floating gate Avalanche injection MOS (hereinafter abbreviated to "FAMOS") transistors. An EPROM is provided with an ultraviolet irradiation window for use in erasing data but the OTP is not.

A user can therefore write data once to the OTP but once written, the data cannot be erased. That is, data cannot be written for an evaluation test after an OTP memory chip was packaged. Because of this, conventionally, data has been read from the OTP memory cells with nothing written therein (at this time, all of the data should be "1") and it has been recognized that there are no structural failure when all of the read data are "1".

However, the above test method has a drawback that structural failure cannot be detected when there is a short between adjacent word lines or between adjacent bit lines. As a result, conventionally, it has not been possible to obtain highly precise results in the evaluation test after the OTP chip was packaged. For example, even if an electrical short have occurred between word lines or bit lines due to thermal stress occurring in the packaging process, it has not been possible to detect such short. This has presented a problem with regards to reducing shipments of defective OTP chips.

When one of the data read in the evaluation test after the OTP chip was packaged is "0", an OTP deficiency can be detected. However, in either case, it is not possible to know whether the cause is a short between word lines, a short between bit lines, or some other cause. This has made it difficult to carry out a test capable of reducing the occurrence of deficient products.

SUMMARY OF THE INVENTION

It is therefore the object of the present invention to provide a semiconductor device for which highly precise evaluation test is possible even after the OTP chip was packaged.

A semiconductor memory device of the present invention comprises a memory cell array including row lines, column lines and memory cells arranged in rows and columns. Each memory cell is connected to one of the row lines and one of the column lines. The semiconductor memory device further comprises a row select circuit connected to the row lines for selecting one of the row lines in response to a row select signal, a column select circuit connected to the column lines for selecting one of the column lines in response to a column select signal, a potential detector connected to the memory cell array for detecting a potential level of the lines of the memory cell array, and a test memory cell array connected to said potential detector through a test line. The test memory cell array tests a structural default of the row lines. The test memory cell array has a row of transistors each of which has a source connected to a potential source. The drains of the transistors are connected to the test line and to nothing in turn.

DETAILED DESCRIPTION OF THE PREFERRED EMBODIMENTS

Figure 1:
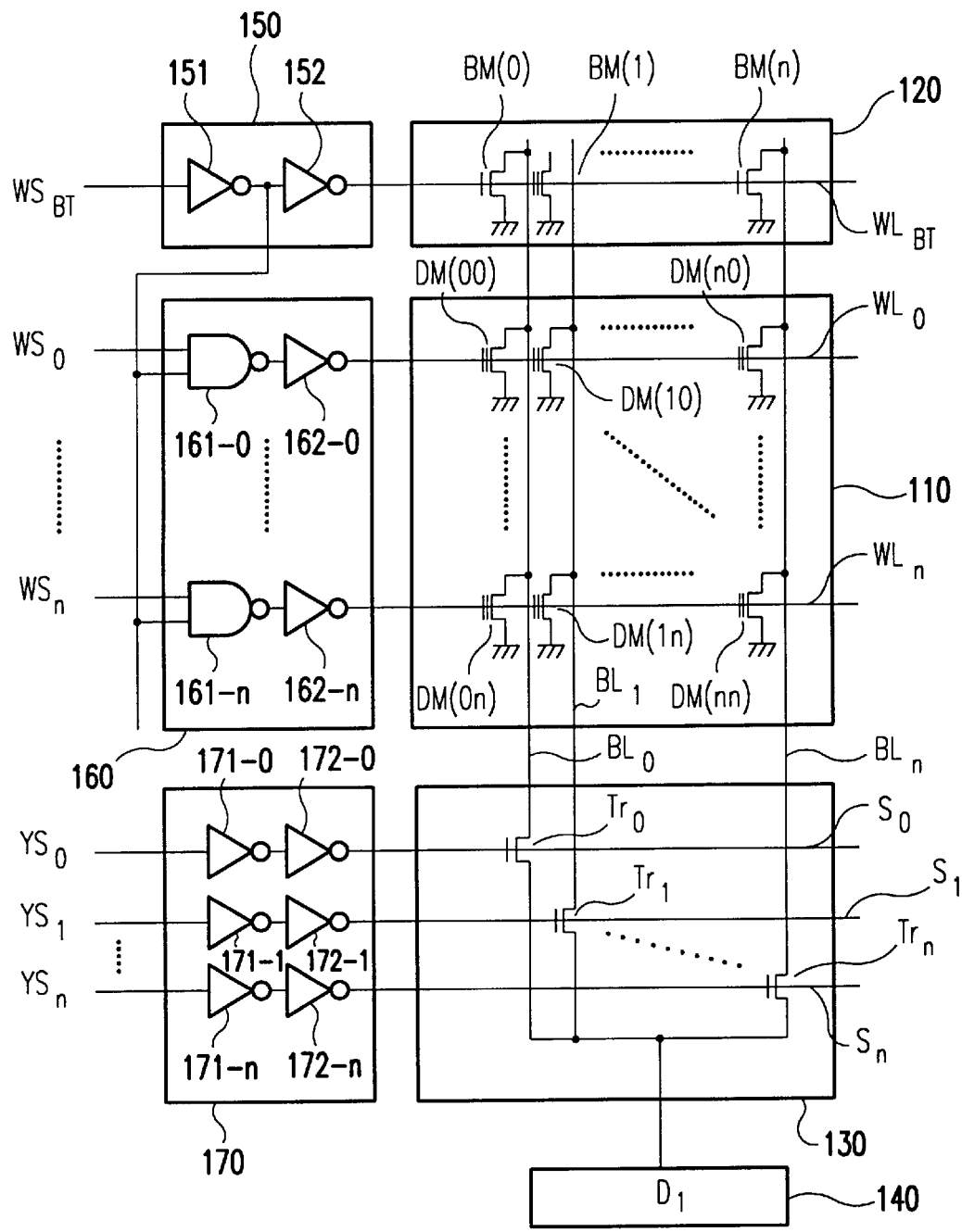
FIG. 1 is a circuit diagram of the essential parts of a semiconductor memory device of a first embodiment.

The following is a description using the drawings of the embodiments of the present invention. The size, dimensions and positional relationship of each of the structural components in the drawings are shown abbreviated to an extent such that the present invention can be understood, and it is wished to be understood that the following conditions are simply provided as an example.

The case where a bit line evaluation test is carried out for an OTP of a first embodiment of the present invention is described using FIG. 1.

FIG. 1 is a circuit diagram showing an outline of the essential parts of the OTP of the first embodiment.

As shown in FIG. 1, a main memory cell array 110 has (n+1)×(n+1) main memory cells DM(00) to DM(nn) arranged in a matrix. Each of the main memory cells DM(00) to DM(nn) has a FAMOS transistor. Control gates of each FAMOS transistors are connected to main word lines WL0 to WLn. The drains of the FAMOS transistors are connected to main bit lines BL0 to BLn. The sources of the FAMOS transistors are connected to ground.

A bit line test memory cell array 120 is provided with n+1 memory cells BM(0) to BM(n) for bit line test use. The memory cells BM(0) to BM(n) are each constructed from a MOS transistor. The gates of each of the MOS transistors are connected to a bit line test word line WLBT. Drains of the MOS transistors of even numbered memory cells BM(0), BM(2), . . . are connected to corresponding main bit lines BL0, BL2, . . . , while drains of transistors of odd numbered memory cells BM(1), BM(3), . . . are floating. The sources of the MOS transistors are connected to ground. The memory cell array 120 is therefore configured so as to form a mask ROM.

A main multiplexer 130 is provided with n+1 MOS transistors Tr0 to Trn. The gates of the transistors Tr0 to Trn are connected to select signal lines S0 to Sn, respectively. The sources of the transistors Tr0 to Trn are connected to the main bit lines BL0 to BLn, respectively. Further, the drains of the transistors Tr0 to Tm are connected to the signal input terminal DI of an amplifier 140. The amplifier 140 outputs current from the signal input terminal DI. The current is supplied to each of the main bit lines BL0 to BLn. The amplifier 140 outputs a signal having a voltage level at this time to outside as read data.

A bit line test driver circuit 150 includes inverters 151 and 152 connected in series. The driver circuit 150 receives a bit line test signal WSBT from an input terminal of the inverter 151. An output terminal of the inverter 152 is connected to the word line WLBT for a bit line test.

A row select driver circuit 160 has NAND gates 161-0 to 161-n and inverters 162-0 and 162-n connected in series. Row select signals WS0 to WSn are input to one of the input terminals of NAND gates 161-0 to 161-n from outside. The output signal of the inverter 151 is then input to the other input terminals of the NAND gates 161-0 to 161-n. Output terminals of the inverters 162-0 and 162-n are connected to the main word lines WL0 to WLn. A column select driver circuit 170 has inverters 171-0 to 172-n connected in series. Column select signals YS0 to YSn are input to input terminals of inverters 171-0 to 171-n. Output terminals of inverters 172-0 to 172-n are connected to select signals S0 to Sn, respectively.

Next, a description is given of the operation of the evaluation tests of the OTP of the first embodiment.

First, outputting of current from the signal input terminal Di of the amplifier 140 is started and the column select signals YS0 to YSn are set to a low level.

Next, the bit line test signal WSBT is put to a high level, the output signal of the inverter 151 is brought to the low level and the output signal of the inverter 152 is brought to the high level. The gate potential of each of the MOS transistors of the memory cells BM(0) to BM(n) is brought to high level and the transistors turn on. The outputs of the NAND gates 161-0 to 161-n are brought to the high level in response to the output signal of the inverter 151 having the low level. The main memory cells DM(00) to DM(nn) do not operate since the output signals of the inverters 162-0 to 162-n (i.e. the potential level of the word lines WL0 to WLn) have the low level. This operation means that the row select driver circuit 160 is inactive.

Next, the potential level of the column select signal YS0 is changed from low to high, and the MOS transistor Tr0 is turned on. The potential level on the bit line BL0 is detected by the amplifier 140. Then the column select signal YS0 is brought to the low level and the MOS transistor Tr0 tuns off. In the similar manner, the potential level on the bit lines BL1, BL2, . . . can be sequentially detected with controlling MOS transistors Tr1, Tr2, . . . using the column select signals YS1, YS2, . . .

As described above, the drains of the MOS transistors of the even numbered memory cells BM(0), BM(2), . . . are connected to the bit lines BL0, BL2, . . . , respectively. The even numbered bit lines BL0, BL2, . . . can therefore be connected to ground via the memory cells BM(0), BM(2), . . . by setting the bit line test signal WSBT to a high level. On the other hand, as there is nothing connected to the drains of the MOS transistors of the odd numbered memory cells BM(1), BM(3), . . . the bit lines BL1, BL3, . . . are not connected to ground.

In case a manufacturing default of the bit lines (i.e. an electrical short between neighboring bit lines) does not exist, all of the even numbered bit lines BL0, BL2, . . . are brought to the low level and all of the odd numbered bit lines BL1, BL3, . . . are brought to the high level. On the other hand, if the short does exist between adjacent bit lines BL2n and BL2n−1, the even numbered bit line BL2n are connected to ground via the odd numbered bit lines BL2n−1. Therefore, both of the bit lines BL2n and BL2n−1 are brought to the low level.

In the first embodiment, all of the signals on the even numbered bit lines BL0, BL2, . . . have the low level and all of the signals on the odd numbered bit lines BL1, BL3, . . . have the high level, it can be determined that there are no manufacturing default in the bit lines. It can also be determined that there is a bit line default when this is not the case.

According to the OTP of the first embodiment, the presence or absence of the bit line short can be detected without writing data to the main memory cells DM(00) to DM(nn). Therefore, the accuracy of evaluation tests can be raised.

Figure 2:
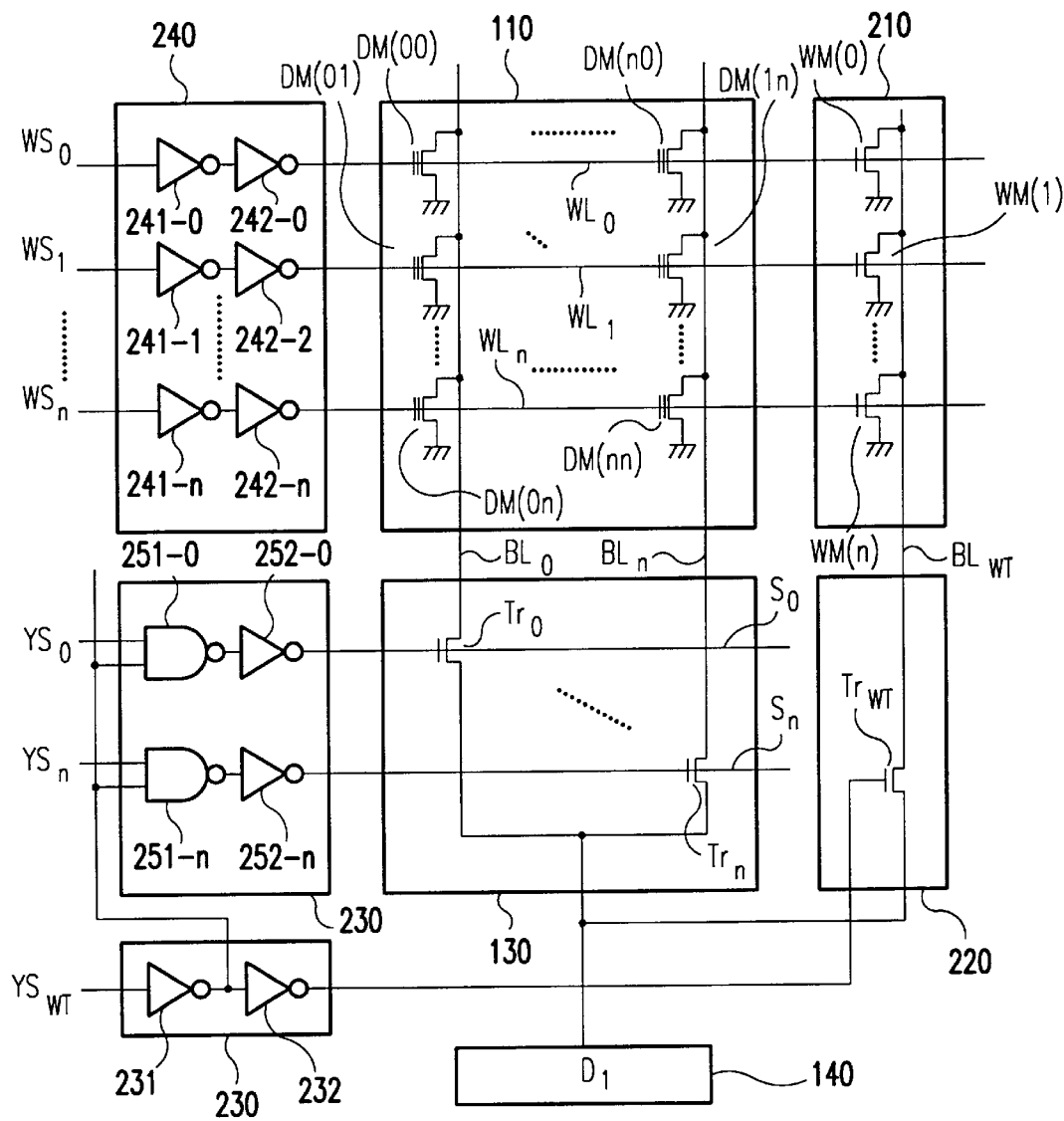
FIG. 2 is a circuit diagram of the essential parts of a semiconductor memory device of a second embodiment.

The following is a description using FIG. 2 of a second embodiment of the present invention. In the second embodiment, a word line evaluation test can be carried out.

FIG. 2 is a circuit diagram showing essential parts of the configuration of the OTP of the second embodiment. In FIG. 2, parts of the configuration that are the same as parts of the configuration of FIG. 1 are given the same numerals and their description is omitted.

In FIG. 2, a word line test memory cell array 210 has n+1 memory cells WM(0) to WM(n) for word test. The memory cells WM(0) to WM(n) are each comprised of an MOS transistor. The gates of the transistors are connected to main word lines WL0 to WLn, respectively. The drains of the transistors of the even numbered memory cells WM(0), WM(2), . . . are connected to a test bit line BLWT. The drains of the transistors of the odd numbered memory cells WM(1), WM(3), . . . are floating. The sources of the transistors are connected to ground so that the memory cell array 210 is configured as a mask ROM.

A word line test multiplexer 220 has a MOS transistor TrWT. The gate of the transistor TrWT is connected to the output terminal of a word line test driver circuit 230. The source of the transistor TrWT is connected to a test bit line BLWT and the drain is connected to the signal input terminal DI of the amplifier 140.

The word line test driver circuit 230 has inverters 231 and 232 connected in series. A bit line test signal YSWT is input to the inverter 231. An output terminal of the inverter 232 is connected to the gate of the transistor TrWT.

A row select driver circuit 240 has inverters 241-0 to 241-n and 242-0 to 242-n connected in series, respectively. Row select signals WS0 to WSn from outside are input to the input terminals of the inverters 241-0 to 241-n. The output terminals of the inverters 242-0 to 242-n are connected to the main word lines WL0 to WLn.

A column select driver circuit 250 has n+1 NAND gates 251-0 to 251-n and inverters 252-0 to 252-n connected in series, respectively. The column select signals YS0 to YSn are input from outside to one of the input terminals of the NAND gates 251-0 to 251-n. The output signal of the inverter 231 is input to the other input terminals of the NAND gates 251-0 to 251-n. The output terminals of each of the inverters 252-0 to 252-n are connected to the gates of the transistors Tr0 to Trn.

The following is a description of the evaluation test operation of the OTP of the second embodiment. First, an electrical current is provided to the bit lines BL0 to BLn from the signal input terminal DI of the amplifier 140 and all of the row select signals WS0 to WSn are set to a low level.

Next, the bit line test signal YSWT is brought to a high level, the output signal of the inverter 231 is brought to the low level and the output signal of the inverter 232 is brought to the high level. As the gate potential of the MOS transistor TrWT is brought to the high level, the transistor TrWT turns on. The output signals of the NAND gates 251-0 to 251-n have the high level in response to the output signal of the inverter gate 231 having the low level. The potential level of the output signals of the inverters 252-0 to 252-n (i.e. the gate potential of the MOS transistors Tr0 to Trn) is brought to the low level and the main bit lines BL0 to BLn are therefore not selected. This operation means that the column select circuit 250 is inactive.

Next, the row select signal WS0 is changed from the low level to the high level and the MOS transistor of the word line testing memory cell WM(0) is turned on. At this w time, the amplifier 140 detects the potential level of the word line test bit line BLWT. Then the row select signal WS0 is changed to the low level again and the transistor is turned off. In the similar manner, transistors of the memory cells WM(1) to WM(n) turn on sequentially in response to the row select signals WS1, WS2 . . . and the potential level of the word line test bit line BLWT is detected by the amplifier 140.

As described above, the drains of transistors of the MOS transistors of the odd numbered memory cells WM(0), WM(2), . . . are connected to bit lines BL0, BL2, . . . , respectively. Therefore, when on of the odd transistors turn on, the bit line BLWT is connected to ground. On the other hand, there is nothing connected to the drains of the MOS transistors of the even numbered memory cells WM(1), WM(3), . . . Therefore the bit lines BLWT is floating when one of the even transistors turns on.

Assuming there are no manufacturing default in the word lines (an electrical short between adjacent word lines), where one of the odd numbered word lines WS0, WS2, . . . is selected, the word line test bit line BLWT is brought to the low level. On the other hand, where one of the even numbered word lines WS1, WS3, . . . is selected, the word line test bit line BLWT is brought to the high level. Assuming the short exists between adjacent word lines WL2n and WL2n-1, the MOS transistor of the memory cell WM2n turns on whichever the word line (WL2n-1 or WL2n) is brought to the high level and the word line test bit line BLWT is brought to the low level.

Where the output voltage of the amplifier 140 is always low level when one of the even numbered word lines WL0, WL2, . . . is selected and the output voltage is always high level when one of the odd numbered word lines WL1, WL3, . . . is selected, it can be determined that there is no manufacturing default in the word lines. It can accordingly be determined that a manufacturing default is present in the word line structure when this is not the case.

According to the OTP of the second embodiment, the presence or absence of the electrical short in the main word lines WL0 to WLn can be detected without writing data to the main memory cells DM(00) to DM(nn) and the accuracy of evaluation tests can therefore be raised accordingly.

Next, a description will be given using FIG. 3 of a third embodiment of the present invention. This embodiment is a combination of the first embodiment and the second embodiment.

Figure 3:
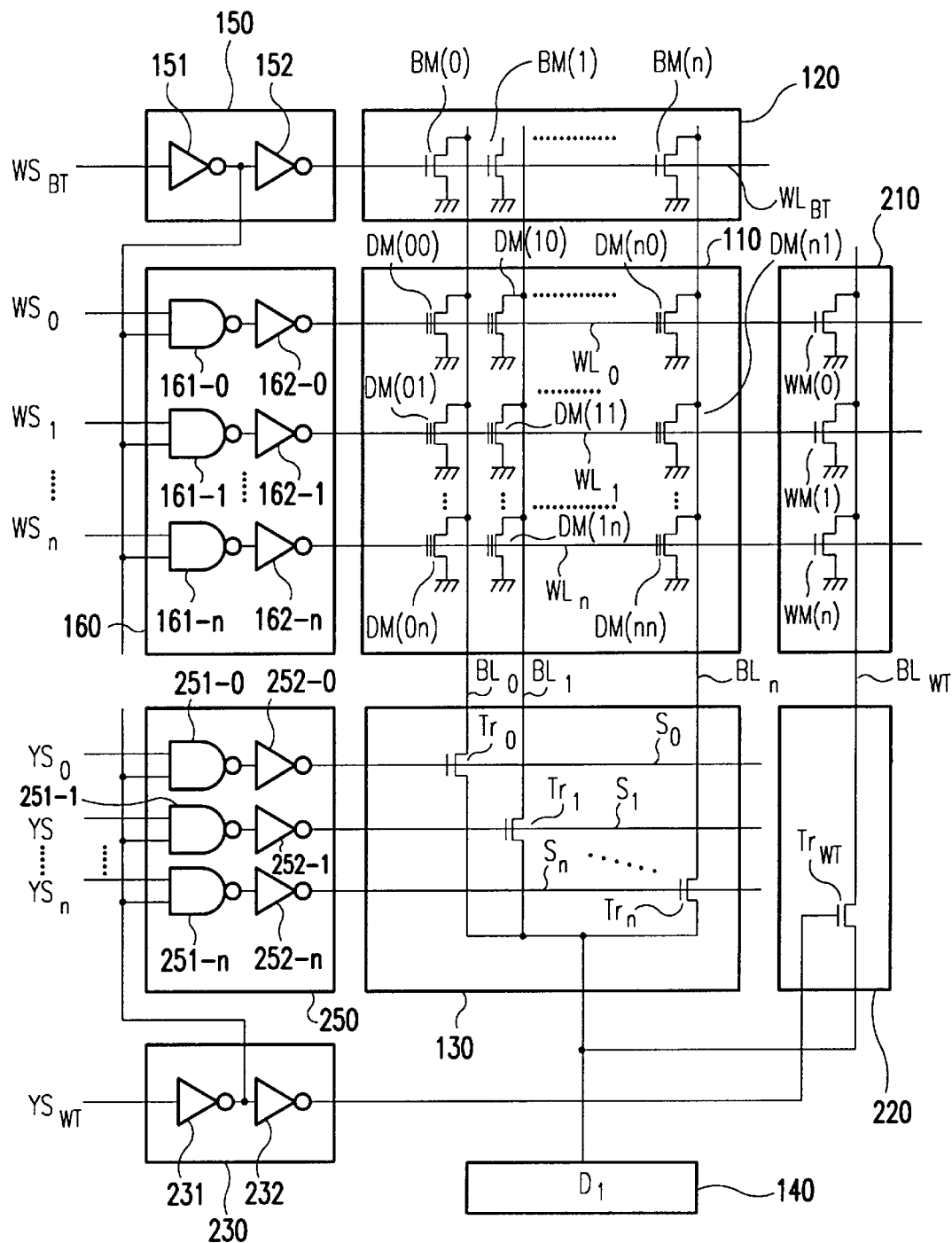
FIG. 3 is a circuit diagram of the essential parts of a semiconductor memory device of a third embodiment.

FIG. 3 is a circuit diagram showing an outline of the essential parts of the configuration of the OTP of the third embodiment. Each of the structural parts shown in FIG. 3 are the same as the structural parts in FIG. 1 and FIG. 2, the same numerals are given. Therefore, the explanation of the circuit structure is omitted.

With the semiconductor storage device shown in FIG. 3, an electrical current from the signal input terminal DI of the amplifier 140 is started to flow in the same way as the case for the first embodiment while the main bit lines BL0 to BLn are being evaluation tested and the column select signals YS0 to YSn are set to a low level.

After the above procedure, the bit line test signal WSBT is set to a high level and the word line test signal YSWT is set to the low level. The potential level of the output signals of NAND gates 161-0 to 161-n then is brought to high because the output signal of the inverter gate 151 has the low level. The main memory cells DM(00) to DM(nn) therefore do not operate. On the other hand, as the output signal of the inverter 231 has the high level, the NAND gates 251-0 to 251-n operate as the inverters (i.e. operate the same way as the column selecting driver circuit 170 of FIG. 1).

Therefore, as in the first embodiment, a manufacturing default of the bit lines can be detected by controlling the column select signals YS0 to YSn and sequentially detecting the main bit lines BL1, BL2, . . .

A description will now be given of the evaluation tests for the main word lines WL0 to WLn for the semiconductor storage device of the third embodiment. First, the providing of a current from the signal input terminal DI of the amplifier 140 to each of the bit lines is started and all of the row select signals WS0 to WSn are put to the low level.

Next, the test signal YSWT is set to the high level and the test signal WSBT is set to the low level. All of the output signals of the NAND gates 251-0 to 251-n have the high level because the output signal of the inverter 231 has the low level. Each of the MOS transistors Tr0 to Trn of the main multiplexer 130 therefore do not turn on. On the other hand, since the output signal of the inverter 151 has the high level, the NAND gates 161-0 to 161-n operate as the inverter (i.e. operate in the same way as the row selecting driver circuit 240 of FIG. 2).

An electrical short in the structure of the main word lines WL0 to WLn can therefore be detected by controlling the row select signals WS0 to WSn, as in the second embodiment.

According to the third embodiment, the presence or absence of shorts between the main bit lines BL0 to BLn and the main word lines WL0 to WLn can be detected without writing data to the main memory cells DM(00) to DM(nn) and the precision of evaluation results can therefore be raised accordingly.

In the embodiments described above, the memory cell array 120 for bit line test and the memory cell array 210 for word line test are configured as mask ROM cells but can also be configured as OTP cells. In this case, evaluation tests can be carried out not only for reading data from the OTP chip but also for writing data to the OTP chip (data should be written to the memory cell arrays 120 and 210 for writing test).

In the above embodiments, one circuit for bit line test (the memory cell array 120 and the bit line testing driver circuit 150) and one circuit for word line test (the memory cell array 210, multiplexer 220 and driver circuit 230) are provided, but it is also possible to provide these circuits more than one. It is then possible to know whether operating deficiencies appearing in these evaluation tests are caused by an electrical short between bit lines or word lines or caused by structural deficiencies of circuits for bit line test or circuits for word line test by carrying out two or more evaluation tests using these test circuits. Differing data can then be stored in the circuits for test so that evaluation tests can be carried out using different data and reliability of evaluation tests can therefore be improved.

What is claimed is:

1. A semiconductor memory device comprising:
   a memory cell array including a plurality of row lines, a plurality of column lines and a plurality of memory cells arranged in rows and columns, each memory cell connected to one of the row lines and one of the column lines;
   a row select circuit connected to the row lines for selecting one of the row lines in response to a row select signal;
   a column select circuit connected to the column lines for selecting one of the column lines in response to a column select signal;
   a potential detector connected to said memory cell array for detecting a potential level of the lines of said memory cell array; and a test memory cell array connected to said potential detector through a test line for testing a structural default of the row lines, said test memory cell array having a row of transistors each of which has a source connected to a potential source, drains of the transistors being connected to the test line and to nothing in turn.

2. A semiconductor memory device according to claim 1, wherein the row lines are bit lines and the column lines are word lines.

3. A semiconductor memory device according to claim 2, wherein said row select circuit is a multiplexer having a plurality of transistors connected between the bit lines and said potential detector.

4. A semiconductor memory device according to claim 3, further comprising a row select driver circuit connected to the multiplexer for turning on one of the transistor in the multiplexer in response to the row select signal.

5. A semiconductor memory device according to claim 2, wherein the test line has a plurality of sub test lines each of which is connected to one of the bit lines.

6. A semiconductor memory device according to claim 5, further comprising a bit line test driver circuit connected to the test memory array and said column select circuit, the bit line test driver circuit turning on the transistors of test memory array in response to a test signal and making said column select circuit inactive in response to the test signal.

7. A semiconductor memory device according to claim 1, wherein the row lines are word lines and the column lines are bit lines.

8. A semiconductor memory device according to claim 7, wherein the test line is connected to said potential detector through a transfer transistor.

9. A semiconductor memory device according to claim 8, further comprising a word line test driver circuit connected to a gate of the transfer transistor, the word line test driver circuit turning on the transfer transistor in response to a test signal and making said row select circuit inactive in response to the test signal.

10. A semiconductor memory device comprising:
   a memory cell array including a plurality of bit lines, a plurality of word lines and a plurality of memory cells arranged in rows and columns, each memory cell connected to one of the bit lines and one of the word lines;
   a potential detector having an input line for detecting a potential level on the input line thereof;
   a row select circuit connected between the bit lines and the input line of said potential detector for selecting one of the row lines in response to a row select signal;
   a column select circuit connected to the word lines for selecting one of the word lines in response to a column select signal; and
   a bit line test memory cell array connected to the bit lines for testing a structural default of the bit lines, said bit line test memory cell array having a row of bit line test transistors each of which has a source connected to a potential source, gates of the bit line test transistors being connected together, drains of the bit line test transistors being connected to one of the bit lines and to nothing in turn.

11. A semiconductor memory device according to claim 10, wherein each of the memory cells has a FAMOS transistor.

12. A semiconductor memory device according to claim 10, wherein each of the test transistors is a MOS transistor.

13. A semiconductor memory device according to claim 10, wherein said row select circuit is a multiplexer having a plurality of transistors connected between the bit lines and said potential detector.

14. A semiconductor memory device according to claim 13, further comprising a row select driver circuit connected to the multiplexer for turning on one of the transistors in the multiplexer in response to the row select signal.

15. A semiconductor memory device according to claim 14, further comprising a bit line test driver circuit connected to the bit line test memory array and said column select circuit, the bit line test driver circuit turning on the bit line test transistors in response to a test signal and making said column select circuit inactive in response to the test signal.

16. A semiconductor memory device according to claim 10, further comprising a word line test memory array having a row of word line test transistors and a test bit line connected to said potential detector, sources of the word line test transistors being connected to the potential source, gates of the word line test transistors being connected to the word lines, respectively, drains of the word line test transistors being connected to the test bit line and to nothing in turn.

17. A semiconductor memory device according to claim 16, further comprising
   a word line test multiplexer having a transistor connected between said potential detector and the test bit line; and
   a word line test driver circuit connected to a gate of the transistor of the word line test multiplexer, the word line test driver circuit turning on the transistor of the word line test multiplexer in response to a word line test signal and making said row select circuit inactive in response to the word line test signal.

18. A semiconductor memory device comprising:
   a memory cell array including a plurality of bit lines, a plurality of word lines and a plurality of memory cells arranged in rows and columns, each memory cell connected to one of the bit lines and one of the word lines;
   a potential detector having an input line for detecting a potential level on the input line thereof;
   a row select circuit connected between the bit lines and the input line of said potential detector for selecting one of the row lines in response to a row select signal;
   a column select circuit connected to the word lines for selecting one of the word lines in response to a column select signal; and
   a word line test memory array having a row of word line test transistors and a test bit line connected to said potential detector, sources of the word line test transistors being connected to a potential source, gates of the word line test transistors being connected to the word lines, respectively, drains of the word line test transistors being connected to the test bit line and to nothing in turn.

19. A semiconductor memory device according to claim 18, wherein each of the memory cells has a FAMOS transistor.

20. A semiconductor memory device according to claim 18, wherein each of the word line test transistors is a MOS transistor.

21. A semiconductor memory device according to claim 18, wherein said row select circuit is a multiplexer having a plurality of transistors connected between the bit lines and said potential detector.

22. A semiconductor memory device according to claim 21, further comprising a row select driver circuit connected to the multiplexer for turning on one of the transistors in the multiplexer in response to the row select signal.

23. A semiconductor memory device according to claim 18, further comprising
- a word line test multiplexer having a transistor connected between said potential detector and the test bit line; and
- a word line test driver circuit connected to a gate of the transistor of the word line test multiplexer, the word line test driver circuit turning on the transistor of the word line test multiplexer in response to a word line test signal and making said row select circuit inactive in response to the word line test signal.

24. A semiconductor memory device according to claim 18, further comprising
- a bit line test memory cell array connected to the bit lines for testing a structural default of the bit lines, said bit line test memory cell array having a row of bit line test transistors each of which has a source connected to the potential source, gates of the bit line test transistors being connected together, drains of the bit line test transistors being connected to one of the bit lines and to nothing in turn.

25. A semiconductor memory device according to claim 24, further comprising a bit line test driver circuit connected to the bit line test memory array and said column select circuit, the bit line test driver circuit turning on the bit line test transistors in response to a test signal and making said column select circuit inactive in response to the test signal.

* * * * *